(12) United States Patent
Wang

(10) Patent No.: US 7,040,905 B1
(45) Date of Patent: May 9, 2006

(54) STRUCTURE FOR COMBINING PRINTING CIRCUIT BOARD WITH RACK

(75) Inventor: Hong-Chuan Wang, Taipei (TW)

(73) Assignee: EPO Science & Technology Inc., Taipei (TW)

( * ) Notice: Subject to any disclaimer, the term of this patent is extended or adjusted under 35 U.S.C. 154(b) by 0 days.

(21) Appl. No.: 11/131,390

(22) Filed: May 18, 2005

(51) Int. Cl.
*H01R 12/00* (2006.01)

(52) U.S. Cl. ............................ 439/76.1; 361/759

(58) Field of Classification Search .............. 439/76.1; 361/756–759, 737, 752, 816, 818; 211/47.1
See application file for complete search history.

(56) References Cited

U.S. PATENT DOCUMENTS

| | | | | |
|---|---|---|---|---|
| 4,346,952 A | * | 8/1982 | Bright et al. | 439/76.1 |
| 5,144,533 A | * | 9/1992 | Annett | 361/740 |
| 5,801,928 A | * | 9/1998 | Burstedt et al. | 361/801 |
| 6,142,793 A | * | 11/2000 | Schremmer et al. | 439/76.1 |
| 6,362,978 B1 | * | 3/2002 | Boe | 361/825 |
| 6,603,669 B1 | * | 8/2003 | Sheen et al. | 361/801 |
| 6,728,112 B1 | * | 4/2004 | Qin et al. | 361/759 |
| 6,752,276 B1 | * | 6/2004 | Rumney | 211/41.17 |
| 6,785,146 B1 | * | 8/2004 | Koike et al. | 361/759 |
| 6,822,878 B1 | * | 11/2004 | Dobbs et al. | 361/807 |
| 6,967,848 B1 | * | 11/2005 | Klatt et al. | 361/759 |

* cited by examiner

*Primary Examiner*—P. Austin Bradley
*Assistant Examiner*—Larisa Tsukerman
(74) *Attorney, Agent, or Firm*—Troxell Law Office, PLLC

(57) ABSTRACT

A structure for combining a printing circuit board with a rack comprises a fixing sheet, a plurality of supporting seats and buckling sheet; the fixing sheet and the buckling sheet are respectively at the opposite sides; the fixing sheet has a level section, a positioning pin is disposed at the lower side of the level section; another pin is disposed at the top end of the supporting seat proximate to the buckling sheet; a buckling tenon is disposed on the top end of said buckling sheet; the fixing sheet, the supporting seats and the buckling sheet are used to fix the printing circuit board without needing other screws and screw drivers, the printing circuit board can then be allowed to combine with or separate from the rack. Whereby, the combination or the detaching operation can be more convenient, the production time and cost can be saved.

7 Claims, 5 Drawing Sheets

STRUCTURE FOR COMBINING PRINTING CIRCUIT BOARD WITH RACK

FIELD OF THE INVENTION

The present invention relates to a structure for combining a printing circuit board with a rack in an electric product such as a computer or optical disk drive.

DESCRIPTION OF RELATED ART

Electronic products such as a computer and optical disk drive all have a printing circuit board for providing a circuit structure needed for the electric product. Generally, screws are used to fix the printing circuit board in a rack of the electric product. But, a plurality of screws and screw drivers are needed while assembling, it is inconvenient and time consuming.

Please refer to FIGS. 1A and 1B. Taiwan Patent No. 241,913 discloses a fixture structure for a printing circuit board of a computer mainframe, comprising bolt sheets 11, engaging seats 12, buckling seats 13, supporting seats 14 and locking seats 15. While assembling, install a printing circuit board 19 slantwise into the lower sides of buckling edges 131 of the buckling seats 13, place the printing circuit board 16 levelly on the upper ends of the supporting seats 14 and the front edges of engaging seats 12, position the printing circuit board 16 with positioning pins 141 of the supporting seats 14; the bolt sheets 11 are inserted into engaging slots 121 of the engaging seats 12 to allow the fixing flanges 111 disposed on the bolt sheets 11 to press on the upper side of the printing circuit board 16 at the front edge of the engaging seats 11 and the level buckling edges of buckling sheets 112 buckle the upper edges of buckling slots 122 of the engaging seats 12 to cause the printing circuit board 16 to be positioned, and then screws are used to screw the locking seats 15. This can fix the printing circuit board 16 on the mainframe accurately.

The structure for fixing a printing circuit board by inserting the bolt sheets into the engaging seats and screwing screws to the locking seats mentioned above not only needs the locking movement of the screws but also needs further to process a mold fabrication to manufacture the bolt sheets and the movement inserting the bolt sheets into the engaging seats; it is assembly time and cost consuming.

SUMMARY OF THE INVENTION

For improving a conventional structure for combining a printing circuit board with a rack in order to reduce assembly components, simplify the assembly operation and save the assembly time and cost, the present invention is proposed.

The main object of the present invention is to provide a structure for combining a printing circuit board with a rack, without using screws and tools to allow the printing circuit board to be combined with the rack more conveniently and be more time consuming.

Another object of the present invention is to provide a structure for combining a printing circuit board with a rack, without needing to manufacture or purchase assembly components such as screws so that the production, cost can be reduced.

BRIEF DESCRIPTION OF THE DRAWINGS

The present invention can be more fully understood by reference to the following description and accompanying drawings, in which.

DETAILED DESCRIPTION OF THE PREFERRED EMBODIMENTS

Figure 1A:
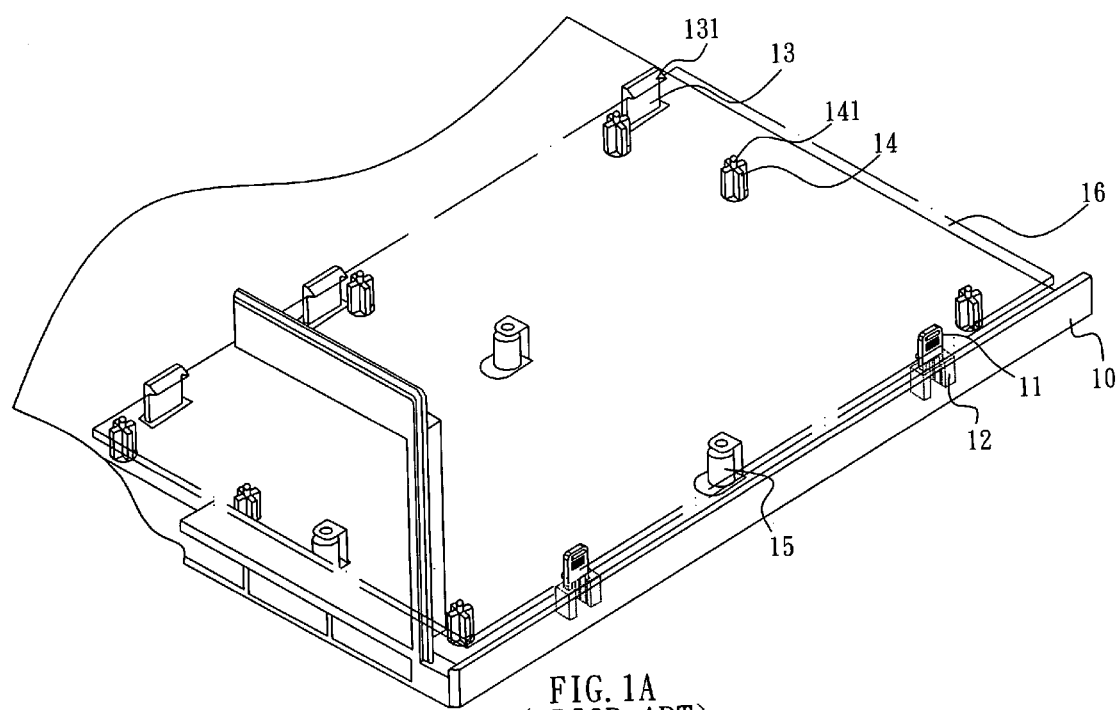
FIGS. 1A and 1B are schematic views, showing a conventional fixture structure of a printing circuit board of a computer.
Figure 1B:
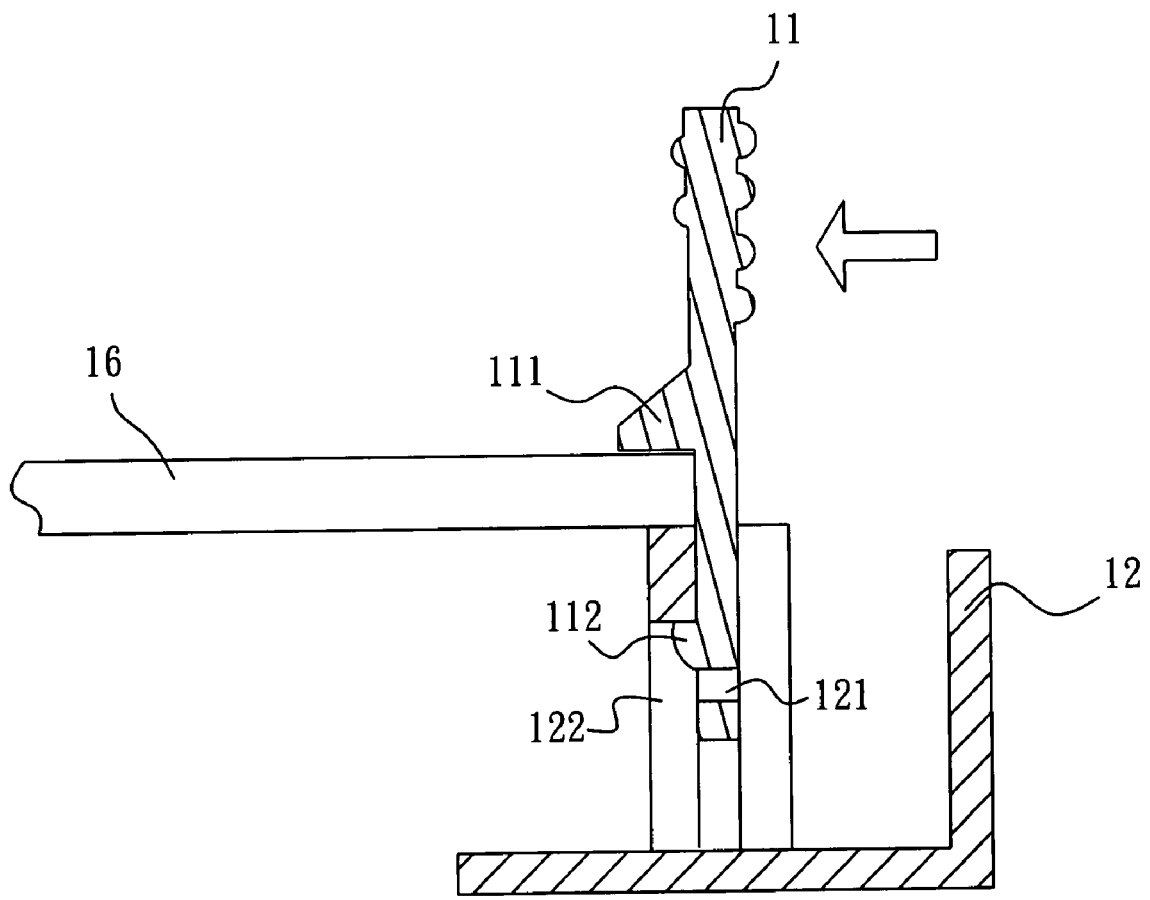
Figure 2:
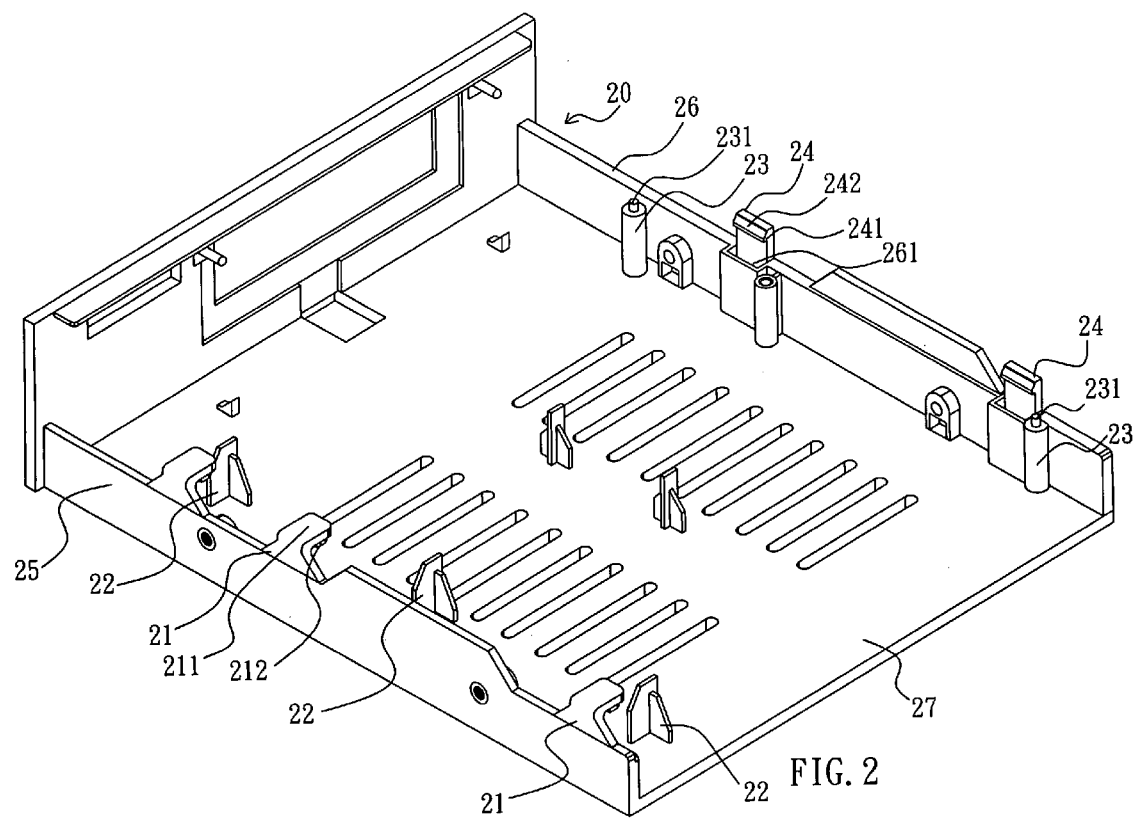
FIG. 2 is a schematic view, showing a structure for combining a printing circuit board with a rack of a preferred embodiment according to the present invention.

Please refer to FIG. 2. A structure for combining a printing circuit board with a rack according to the present comprises a rack 20 having at least one fixing sheet 21, a plurality of supporting seats 22, 23 and at least one buckling sheet 24, in which the fixing sheet 21 and the buckling sheet 24 are respectively at two opposite sides of the rack 20 and the supporting seats 22, 23 are disposed between the fixing sheet 21 and buckling sheet 24. In a preferred embodiment of the present invention, the fixing sheet 21 is extended out from the upper end of a first side plate 25 of the rack 20 and has a level section 211 with a positioning pin 212 bended levelly toward the inner side of the rack 20 disposed at the lower side thereof. The first side plate 25, the supporting seats 22 and 23, the buckling sheet 24 and a second side plate 26 are all extended upward from a bottom plate 27 of the rack 20. The second side plate 26 is at a side of the rack 20 opposite to the first side plate 25. At least one indented slot 261 is disposed in the second side plate 26 for accepting the buckling sheet 24. A positioning pin 231 is disposed on the top end of each supporting seat 23 proximal to the buckling sheet 24. A buckling tenon 241 projected out toward the inner side of the rack 20 is disposed at the upper end of the buckling sheet 24. The upper end of the buckling tenon 241 has an inclined plane 242 inclined from the upper of the outer side thereof toward the lower of the inner side thereof.

Figure 3:
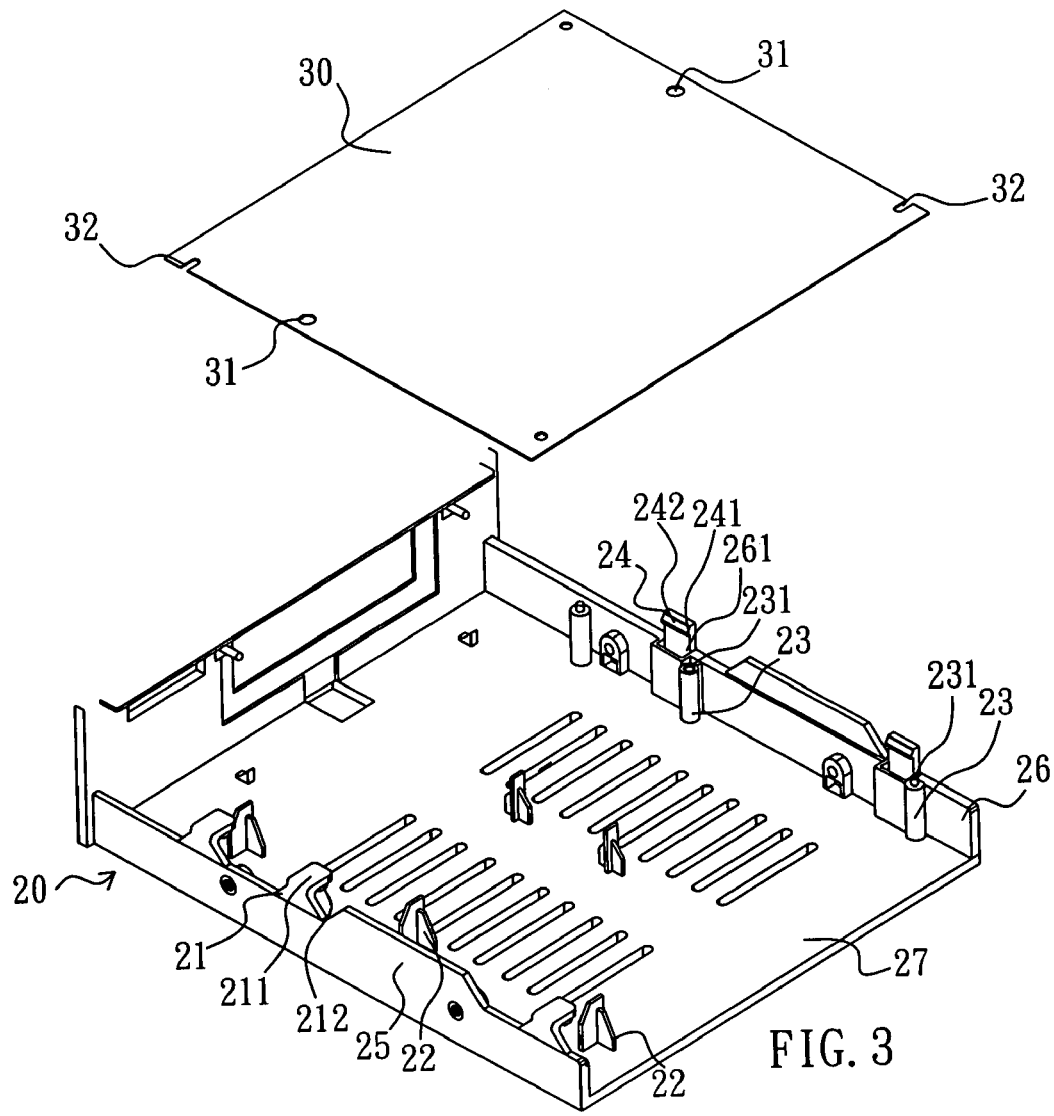
FIG. 3 is a schematic view, showing a printing circuit board and a rack of a preferred embodiment according to the present invention in a separation state.
Figure 4:
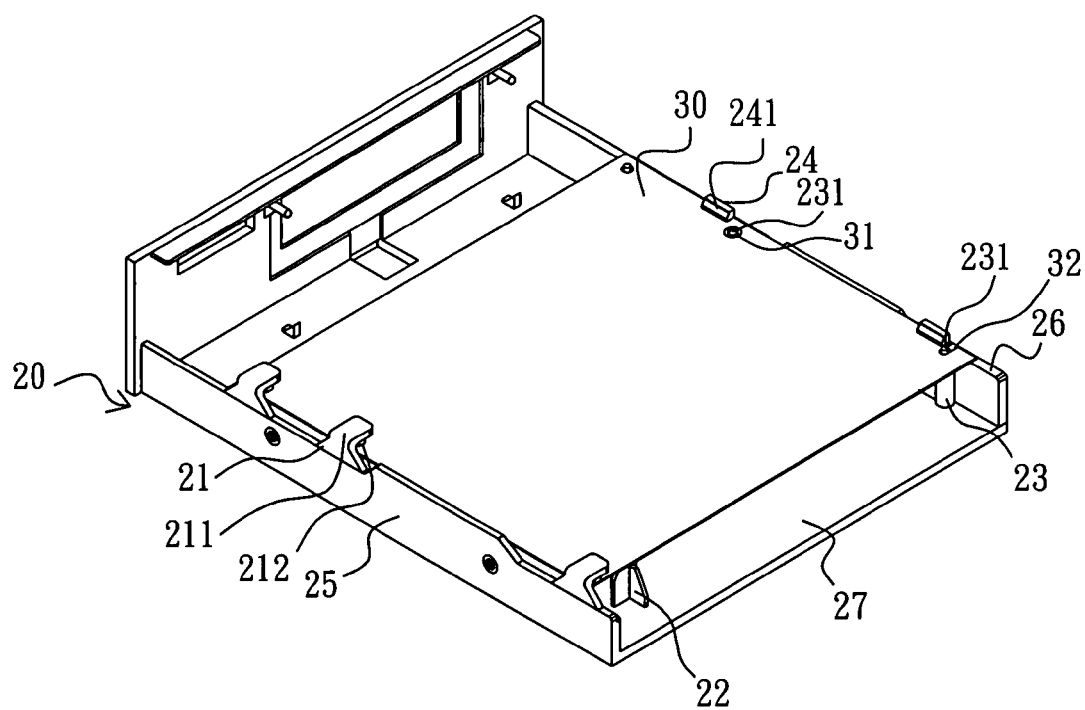
FIG. 4 is a schematic view, showing a printing circuit board and a rack of a preferred embodiment according to the present invention in a combination state.

Please refer to FIGS. 3 and 4. The positioning pin 212 of the fixing sheet 21 and the positioning pin 231 of the supporting seat 23 proximal to the buckling sheet 24 are respectively corresponding to at least one buckling hole 31 or at least one groove hole 32 in a printing circuit board 30. The supporting seat 22 and 23 are respectively used to support the printing circuit board 30 at the lower side thereof.

When the printing circuit board 30 is combined with the rack 20, the buckling hole 31 or the groove hole 32 at one side of the printing circuit board 30 is first allowed to engage with the positioning pin 212 at the lower side of the level section 211 of the fixing sheet 21, the lower end of the printing circuit board 30 is placed on the upper end of the supporting seat 22. And then, another side of the printing circuit board 30 is allowed to press downward against the inclined plane 242 of the buckling tenon 241 of the buckling sheet 24 to cause the upper end of the buckling sheet 24 to be deviated toward the outer side of the rack 20 to allow the another side of the printing circuit board 30 to be passed through the buckling tenon 241 of the buckling sheet 24 to cause the buckling hole 31 or the groove hole 32 to be engaged with the positioning pin 231 of the supporting seat 23 proximal to the buckling sheet 24. In the meantime, the upper end of the buckling sheet 24 restores to its original position to allow the buckling tenon 241 thereof to be buckled to the outside of the another side of the printing circuit board 30.

The positioning pin 212 of the fixing sheet 21 and the positioning pin 231 of the supporting seat 23 are used to buckle into the buckling hole 31 or the groove hole 31 of the printing circuit board 30 respectively from the upper end of the printing circuit board 30 downward and from the lower end thereof upward to cause the printing circuit board to be fixed and not to be able to be moved levelly. And then, the level section 211 of the fixing sheet 21, the buckling tenon 241 of the buckling sheet 24 and the supporting seats 22, 23 are respectively used to clamp the upper and lower sides of the printing circuit board 30 to cause the printing circuit board 30 not to be able to be moved vertically up and down to allow the printing circuit board 30 and the rack 20 to be stably combined, as FIG. 4 shows.

When a user wants to separate the printing circuit board 30 from the rack 20, he only needs to a hand to cause the upper end of the buckling sheet 24 to deviate toward the outer side of the rack 20 to allow the buckling tenon 241 to separate from the position that the printing circuit board 30 is buckled, and then to lift one side of the printing circuit board 30 upward to cause another side of the printing circuit board 30 to be inclined downward to release from the restraint of the fixing sheet 21. And then, the printing circuit board 30 can be separated from the rack 20 easily.

A buckling structure of the present invention can be formed into one body with a rack; it is unnecessary to purchase extra parts for combining a printing circuit board or further do a mold fabrication to manufacture combination parts so that the production cost can be saved. It doesn't need additional screws and screw drivers according to the present invention, the printing circuit board can then be allowed to combine with or separate from the rack and the combination or detaching operation is allowed to be more convenient and more time consuming.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A structure for combining a printing circuit board with a rack, comprising a rack with at least one fixing sheet, a plurality of supporting seats and at least one buckling sheet; said fixing sheet and said buckling sheet being at the opposite sides of said rack, said supporting seats being disposed between said fixing sheet and said buckling sheet; said fixing sheet having a level section bended levelly toward the inner side of said rack and a positioning pin being disposed at the lower side of said level section; another position pin being disposed at the top end of said supporting seat proximal to said buckling sheet; a buckling tenon projected out toward the inner side of said rack being disposed at the top end of said buckling sheet; whereby, said positioning pin of said fixing sheet and said positioning pin of said supporting seat are used to buckle into a buckling hole or groove hole of a printing circuit board respectively from the upper end of said printing circuit board downward and from the lower end thereof upward to allow said printing circuit board to be fixed and not to be able to be moved levelly, and said level section of said fixing sheet, said tenon of said buckling sheet and said supporting seats are used to clamp the upper and lower sides of said printing circuit board respectively to allow said printing circuit board not to be able to be moved upward and downward vertically.

2. The structure according to claim 1, wherein said tenon of said buckling sheet has an inclined plane from the upper of the outer side thereof to the lower of the inner side thereof on the upper end thereof.

3. The structure according to claim 2, wherein said fixing sheet is extended out form the upper end of a first side plate of said rack.

4. The structure according to claim 3, wherein said rack has a second side plate, said second side plate is disposed oppositely to said first side plate; said second side plate has an indented groove, said buckling sheet is accepted in said indented groove.

5. The structure according to claim 4, wherein said first side plate, said supporting seats, said second side plate and said buckling sheet all are extended out upward from a bottom plate of said rack.

6. The structure according to claim 5, wherein said first side plate, said supporting seats, said second sideplate, said buckling sheet and said bottom plate are formed into one body.

7. The structure according to claim 1, wherein said rack has a second side plate; said second side plate has an indented groove, said buckling sheet is accept in said indented groove.

* * * * *